(12) United States Patent
Chen et al.

(10) Patent No.: US 10,811,420 B2
(45) Date of Patent: Oct. 20, 2020

(54) SEMICONDUCTOR STRUCTURE AND METHOD FOR FORMING THE SAME

(71) Applicant: NANYA TECHNOLOGY CORPORATION, New Taipei (TW)

(72) Inventors: Szu-Han Chen, New Taipei (TW); Hsu Chiang, New Taipei (TW); Ching-Yuan Kuo, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/502,785

(22) Filed: Jul. 3, 2019

(65) Prior Publication Data

US 2020/0168613 A1 May 28, 2020

Related U.S. Application Data

(60) Provisional application No. 62/770,903, filed on Nov. 23, 2018.

(51) Int. Cl.
| | | |
|---|---|---|
| *H01L 27/108* | (2006.01) | |
| *H01L 21/311* | (2006.01) | |
| *H01L 29/49* | (2006.01) | |
| *H01L 21/768* | (2006.01) | |

(52) U.S. Cl.
CPC ...... *H01L 27/10885* (2013.01); *H01L 21/311* (2013.01); *H01L 21/76801* (2013.01); *H01L 29/4941* (2013.01)

(58) Field of Classification Search
CPC ............. H01L 27/10885; H01L 21/311; H01L 21/76801; H01L 29/4941
USPC ........................................................ 257/296
See application file for complete search history.

(56) References Cited

U.S. PATENT DOCUMENTS 7,247,906 B2 * 7/2007 Park .................. H01L 21/76895
257/305

\* cited by examiner

*Primary Examiner* — Tu-Tu V Ho
(74) *Attorney, Agent, or Firm* — Muncy, Geissler, Olds & Lowe, P.C.

(57) ABSTRACT

The present disclosure provides a semiconductor structure and a method for forming the semiconductor structure. The semiconductor structure includes: a polysilicon layer, having a first surface and a second surface opposite to the first surface; a substrate, disposed on the second surface of the polysilicon layer; a bit line structure, disposed on the substrate, penetrating through the polysilicon layer and protruding from the first surface of the polysilicon layer; and a spacer structure, disposed on lateral sidewalls of the bit line structure, including an air gap sandwiched by a first dielectric layer and a second dielectric layer, wherein a first portion of the second dielectric layer is in the polysilicon layer, a second portion of the second dielectric layer is outside the polysilicon layer, and a thickness of the second portion of the second dielectric layer is less than a thickness of the first portion of the second dielectric layer.

15 Claims, 16 Drawing Sheets

SEMICONDUCTOR STRUCTURE AND METHOD FOR FORMING THE SAME

PRIORITY CLAIM AND CROSS-REFERENCE

This application claims the priority benefit of U.S. provisional patent application No. 62/770,903, filed on Nov. 23, 2018. The entirety of the above-mentioned patent application is hereby incorporated by reference herein and made a part of this specification.

TECHNICAL FIELD

The present disclosure relates to a semiconductor structure and a method for forming the same.

DISCUSSION OF THE BACKGROUND

A conventional dynamic random access memory (DRAM) cell consists of a transistor and a capacitor. The source of the transistor is connected to a corresponding bit line. The drain of the transistor is connected to a storage electrode of the capacitor. The gate of the transistor is connected to a corresponding word line. An opposite electrode of the capacitor is biased with a constant voltage source. A landing pad is formed for a purpose of electrical interconnection. However, as the DRAM cells become increasingly small, the highly compact structures of the DRAM cells result in limited spacing for formation of the landing pads.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a semiconductor structure. The method includes: receiving a substrate; forming a first bit line on the substrate, the bit line having a top surface away from the substrate and a sidewall connecting the top surface of the bit line to the substrate; forming a landing pad over the first bit line, wherein the landing pad covers the sidewall and a portion of the top surface of the first bit line; and removing a top corner of the landing pad to form an inclined surface connecting a top surface to a sidewall of the landing pad.

In some embodiments, the method further includes: forming a second bit line on the substrate and adjacent to the first bit line, wherein the landing pad includes a first portion formed over the first bit line and a second portion formed between the first bit line and the second bit line.

In some embodiments, the removal of the top corner of the landing pad includes: removing a portion of the first portion of the landing pad; and removing a portion of the second portion of the landing pad.

In some embodiments, the inclined surface of the landing pad is formed between the first bit line and the second bit line.

In some embodiments, a spacer etching is performed to remove the top corner of the landing pad, and the inclined surface is a convex surface.

In some embodiments, a directional etching is performed to remove the top corner of the landing pad, and the inclined surface is a concave surface.

In some embodiments, a tilt dry-etching is performed to remove the top corner of the landing pad, and the inclined surface is a substantially flat surface.

Another aspect of the present disclosure provides a semiconductor structure. The semiconductor structure includes: a substrate; a first bit line, disposed on and protruding from the substrate, and having a sidewall and an ascending top portion, wherein the sidewall of the first bit line connects the ascending top portion of the bit line to the substrate; and a first landing pad, disposed over the ascending top portion and the sidewall of the first bit line, wherein the first landing pad has an inclined surface corresponding to the ascending top portion of the first bit line.

In some embodiments, the inclined surface of the first landing pad is a curved surface.

In some embodiments, the inclined surface of the first landing pad facing away from the first bit line is a concave surface.

In some embodiments, the inclined surface of the first landing pad facing away from the first bit line is a convex surface.

In some embodiments, the inclined surface of the first landing pad is a substantially flat surface.

In some embodiments, the inclined surface of the first landing pad extends along substantially the same direction as an extending direction of the ascending portion.

In some embodiments, the semiconductor structure further includes: a second bit line, disposed adjacent to the first bit line on the substrate; and a second landing pad, disposed over a top surface and a sidewall of the second bit line, and adjacent to the first landing pad.

In some embodiments, the first landing pad includes a first portion above the first bit line and a second portion between the first bit line and the second bit line, the second landing pad includes a third portion above the second bit line, and a first distance between the first portion of the first landing pad and the third portion of the second landing pad is greater than a second distance between the second portion of the first landing pad and the third portion of the second landing pad from a cross-sectional perspective.

With the above-mentioned configurations, a distance between tops of two adjacent landing pads can be increased, and thus a metal bridging of two landing pads due to very narrow spacing can be prevented.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
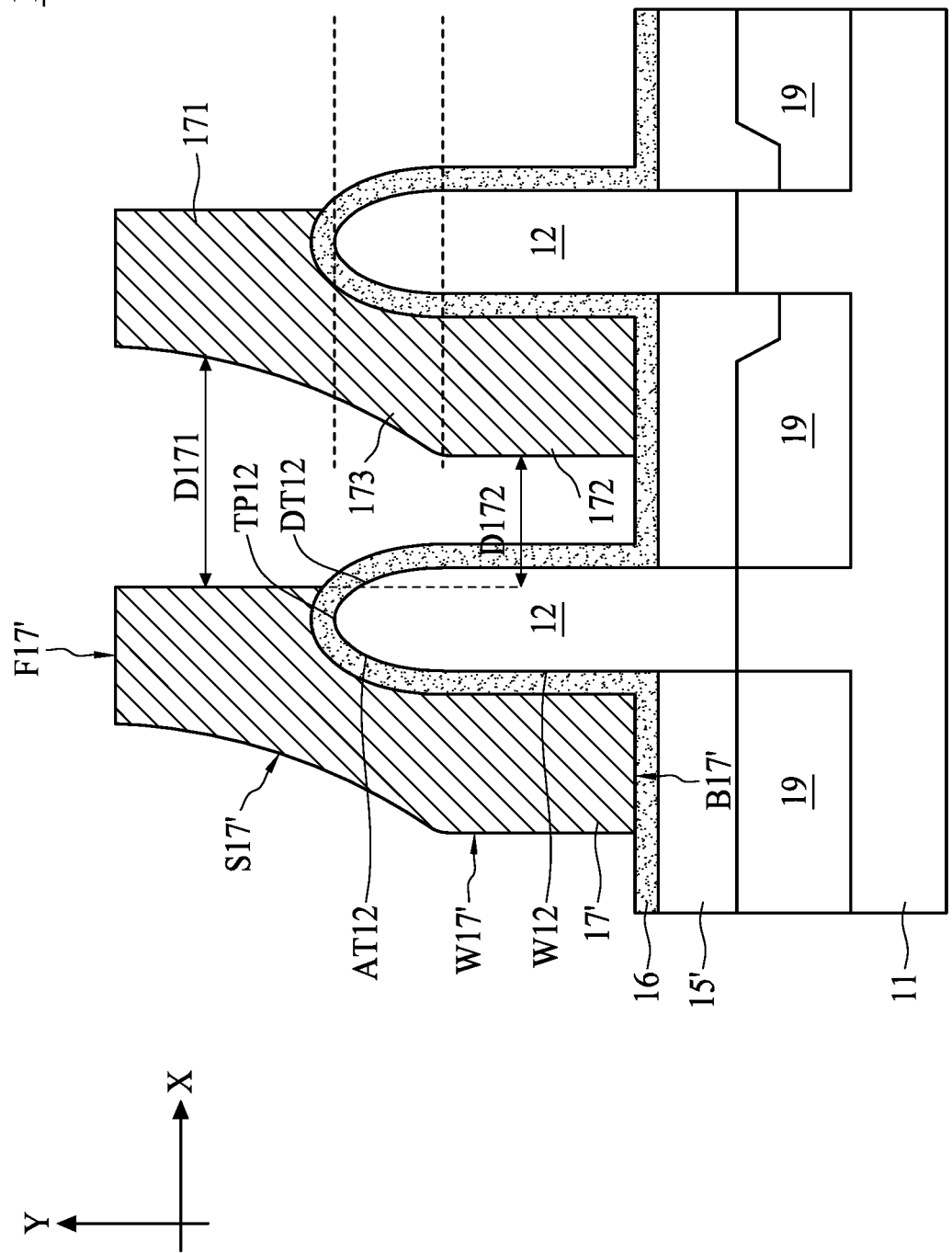
FIG. 1 shows a cross-sectional diagram of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional diagram of a semiconductor structure 100 in accordance with some embodiments of the present disclosure. In some embodiments, the semiconductor structure 100 includes a substrate 11, a bit line structure 12, and a landing pad 17'. In some embodiments, the bit line structure 12 is disposed on and protrudes from the substrate 11. In some embodiments, the semiconductor structure 100 further includes a conductive/semiconductive structure 15'.

In some embodiments, the conductive/semiconductive structure 15' is a multi-layer structure including a polysilicon layer and a metal layer stacked on the substrate 11 in sequence. In some embodiments, the bit line structure 12 includes a pair of spacers at two lateral sides (not shown). In some embodiments, the semiconductor structure 100 further includes an adhesion layer 16 disposed over source/drain regions 19 in the substrate 11 between two adjacent bit line structures 12, wherein the source/drain regions 19 are disposed between the plurality of bit line structures 12. In some embodiments, the adhesion layer 16 is for a purpose of increase adhesion between landing pads 17' (to be formed later in the process) and the bit line structures 12 to prevent peeling off of the landing pads 17'.

In some embodiment, the bit line structure 12 is a pillar having a rounded top. In some embodiments, the bit line structure 12 includes a sidewall W12, an ascending top portion AT12, a top portion TP12 and a descending portion DT12. In some embodiments, the ascending top portion AT12, the top portion TP12 and the descending portion DT12 together form the rounded top. In some embodiments, the sidewall W12 connects the ascending top portion AT12 to the substrate 11. In some embodiments, the top portion AT12 connects the ascending portion AT17' and the descending portion DT12. In some embodiments, the landing pad 17' is disposed over the sidewall W12 and the ascending top portion AT12. In some embodiments, the landing pad 17' covers the top portion TP12 from a cross-sectional perspective. In some embodiments, the landing pad 17' covers a portion of the descending portion DT12 that connects with the top portion TP12 from a cross-sectional perspective.

In some embodiments, the landing pad 17' includes a sidewall W17', an inclined surface S17', a top surface F17' and a bottom surface B17'. In some embodiments, the sidewall W17' of the landing pad 17' is substantially parallel to the sidewall W12 of the bit line structure 12. In some embodiments, the bottom surface B17' faces toward the substrate 11. In some embodiments, the bottom surface B17' contacts the adhesion layer 16. In some embodiments, the top surface F17' is opposite to the bottom surface B17'. In some embodiments, the inclined surface S17' connects the sidewall W17' to the top surface F17'. In some embodiments, the inclined surface S17' is disposed on the bit line structure 12 at a location corresponding to a position of the ascending top portion AT12.

Figure 2:
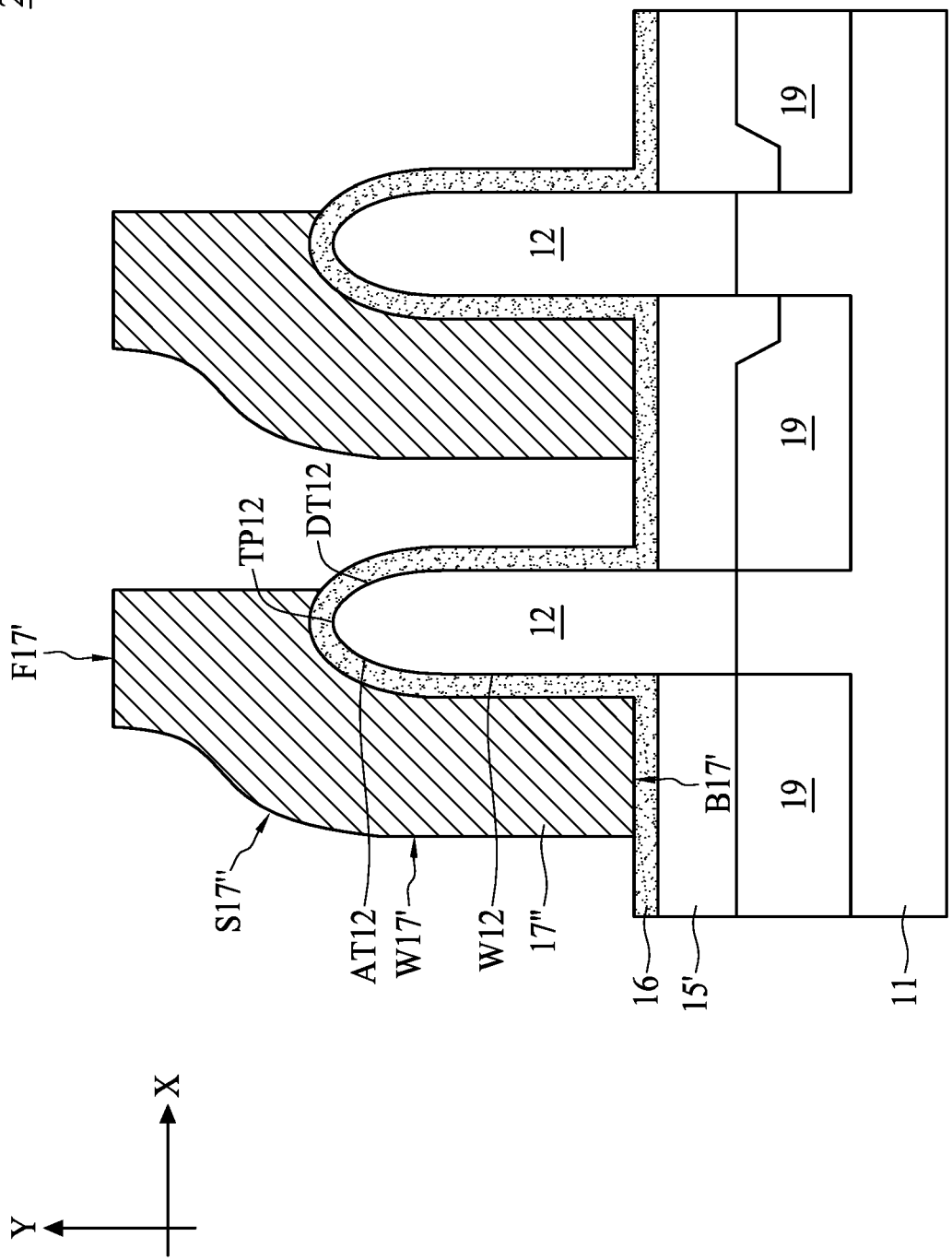
FIG. 2 shows a cross-sectional diagram of a semiconductor structure in accordance with some embodiments of the present disclosure.
Figure 3:
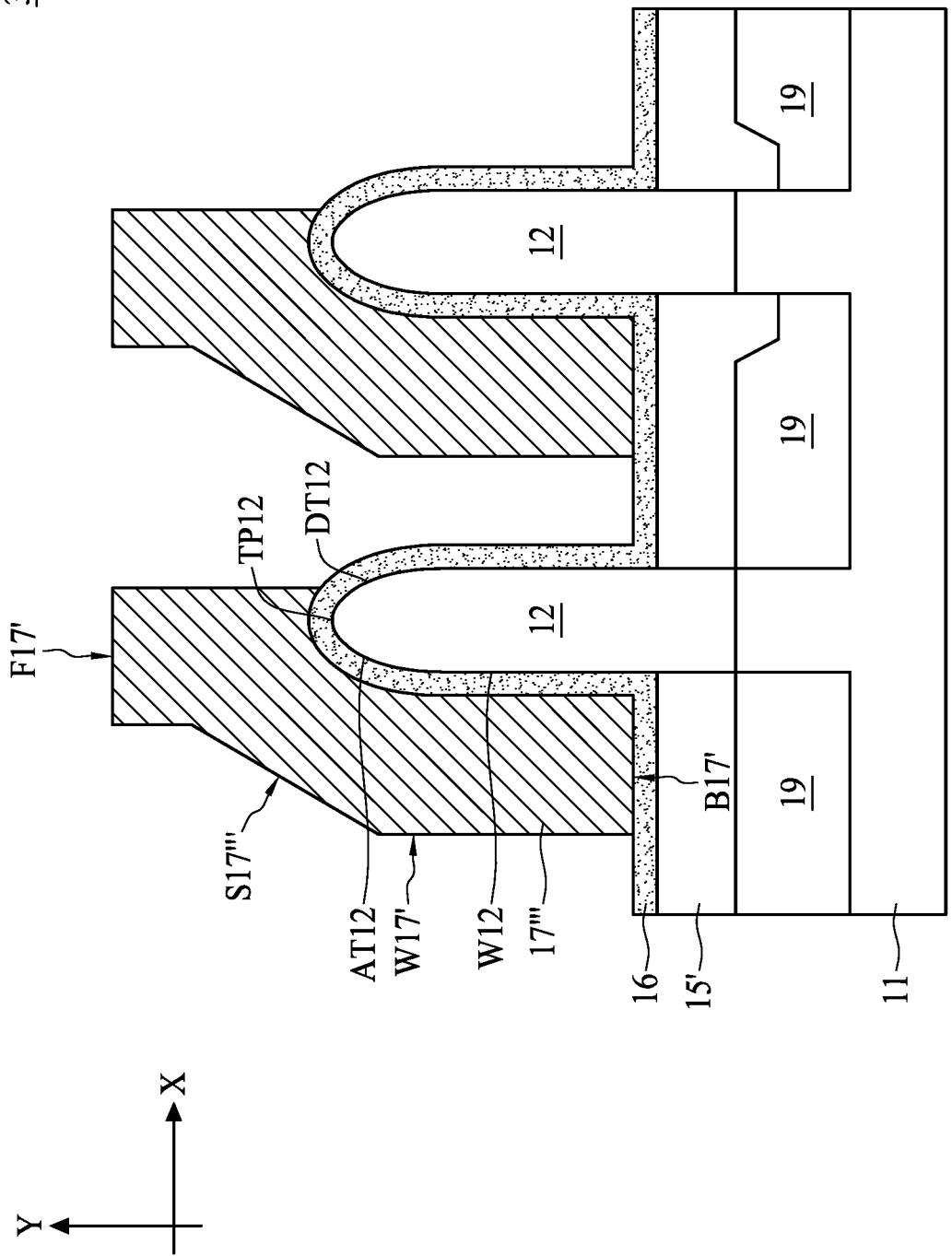
FIG. 3 shows a cross-sectional diagram of a semiconductor structure in accordance with some embodiments of the present disclosure.

In some embodiments, the landing pad 17' includes a first portion 171, a second portion 172, and a connecting portion 173. In some embodiments, the first portion 171 is defined as a portion of the landing pad 17' above the bit line structure 12 from a cross-sectional perspective. In some embodiments, the second portion 172 is defined as a portion of the landing pad 17' laterally adjacent to the sidewall W12 of the bit line structure 12 from the cross-sectional perspective. In some embodiments, the connecting portion 173 is defined as a portion of the landing pad 17' connecting the first portion 171 and the second portion 172, or a portion of the landing pad 17' laterally adjacent to the ascending portion AT12 of the bit line structure 12. The term "lateral" as used in the description of FIGS. 1 to 3 represents an X direction, or a direction parallel to an extending direction of the substrate 11. In some embodiments, a distance D171 between adjacent first portions 171 of each of two adjacent landing pads 17' is greater than a distance D172 between a first portion 171 of one of the two adjacent landing pads 17' and second portion 172 of the other of the two adjacent landing pads 17' from a cross-sectional perspective.

In some embodiments, the inclined surface S17' of the landing pad 17' facing away from the bit line structure 12 is a concave surface as shown in FIG. 1. However, a configuration of the inclined surface S17' is not limited herein. In some embodiments as shown in FIG. 2 of a semiconductor structure 200, a landing pad 17" includes an inclined surface S17" facing away from the bit line structure 12, wherein the inclined surface S17" is a convex surface. In some embodiments as shown in FIG. 3 of a semiconductor structure 300, a landing pad 17''' includes an inclined surface S17''', wherein the inclined surface S17''' is a substantially flat surface. It should be noted that, the references of 17', 17", 17''', S17', S17" and S17''' are for purpose of identifying different landing pads and different inclined surfaces with different configurations, and it is not intended to limit the present disclosure to specific configurations of landing pads. A configuration of the inclined surface depends on the technique and operations used in the formation of the landing pad.

Figure 4:
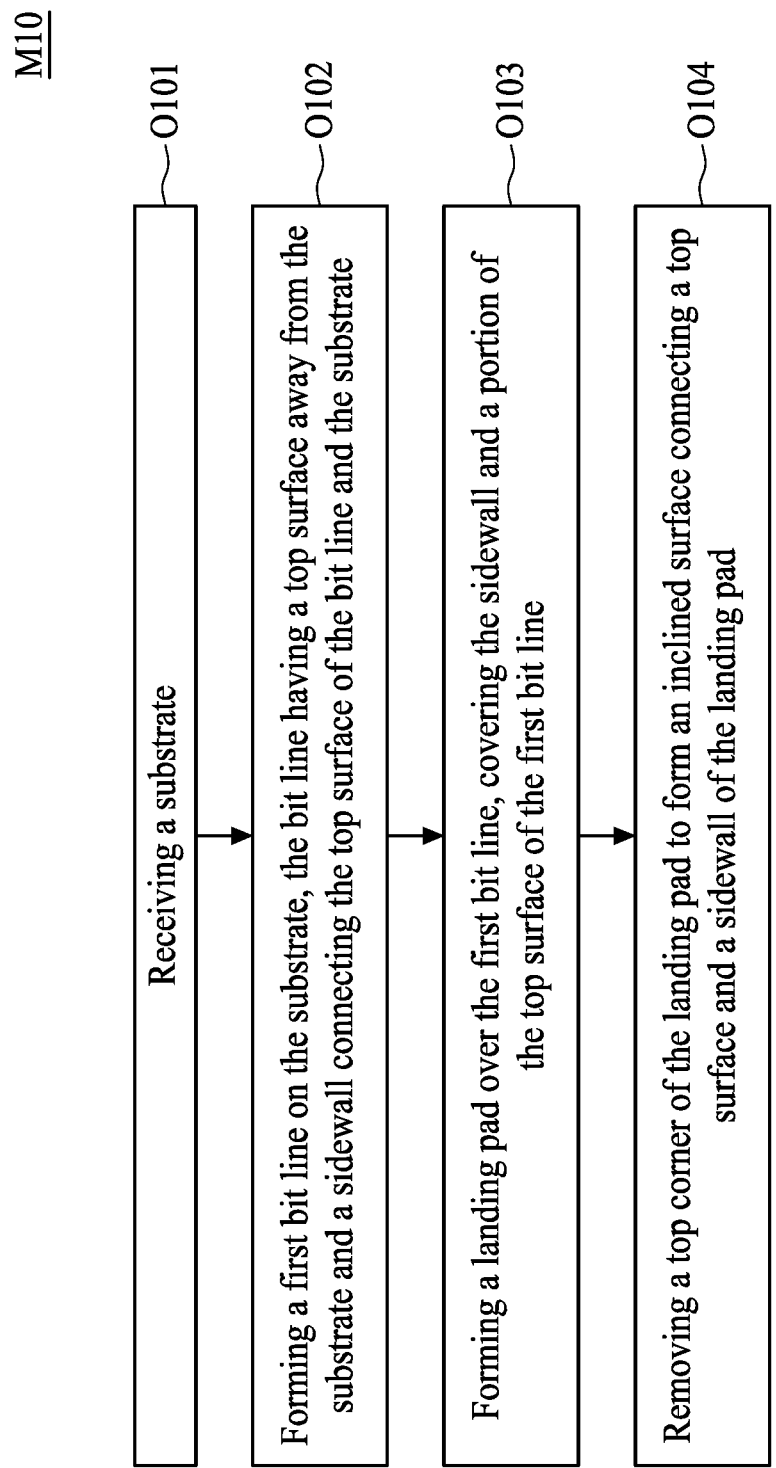
FIG. 4 is flowchart of a method for manufacturing a semiconductor structure in accordance with some embodiments of the present disclosure.

FIG. 4 is a flowchart of a method M10 for manufacturing a semiconductor structure similar to one or more of the semiconductor structures 100, 200 and 300 as shown in FIGS. 1 to 3. The method M10 includes: an operation O101 of receiving a substrate; an operation O102 of forming a first bit line on the substrate, the bit line having a top surface facing away from the substrate and a sidewall connecting the top surface of the bit line to the substrate; an operation O103 of forming a landing pad over the first bit line, covering the sidewall and a portion of the top surface of the first bit line; and an operation O104 of removing a top corner of the landing pad to form an inclined surface connecting a top surface to a sidewall of the landing pad.

In order to further illustrate concepts of the present disclosure, various embodiments are provided below. However, it is not intended to limit the present disclosure to specific embodiments. In addition, conditions or parameters illustrated in different embodiments can be combined or modified to have different combinations of embodiments as long as the parameters or conditions used are not conflicted.

FIGS. 5 to 13 are cross-sectional diagrams of manufacturing a semiconductor structure by the method M10 in accordance with one or more embodiments of the present disclosure. For ease of illustration, the elements and structures shown in FIGS. 5 to 13 are ideal or theoretical configurations. However, a person ordinarily skilled in the art should understand a practical or actual structure formed following the method M10 may not have perfect rectangle configurations or corners with perfect right angles. The actual structure should be more like the semiconductor structures shown in FIGS. 1 to 3.

Figure 5:
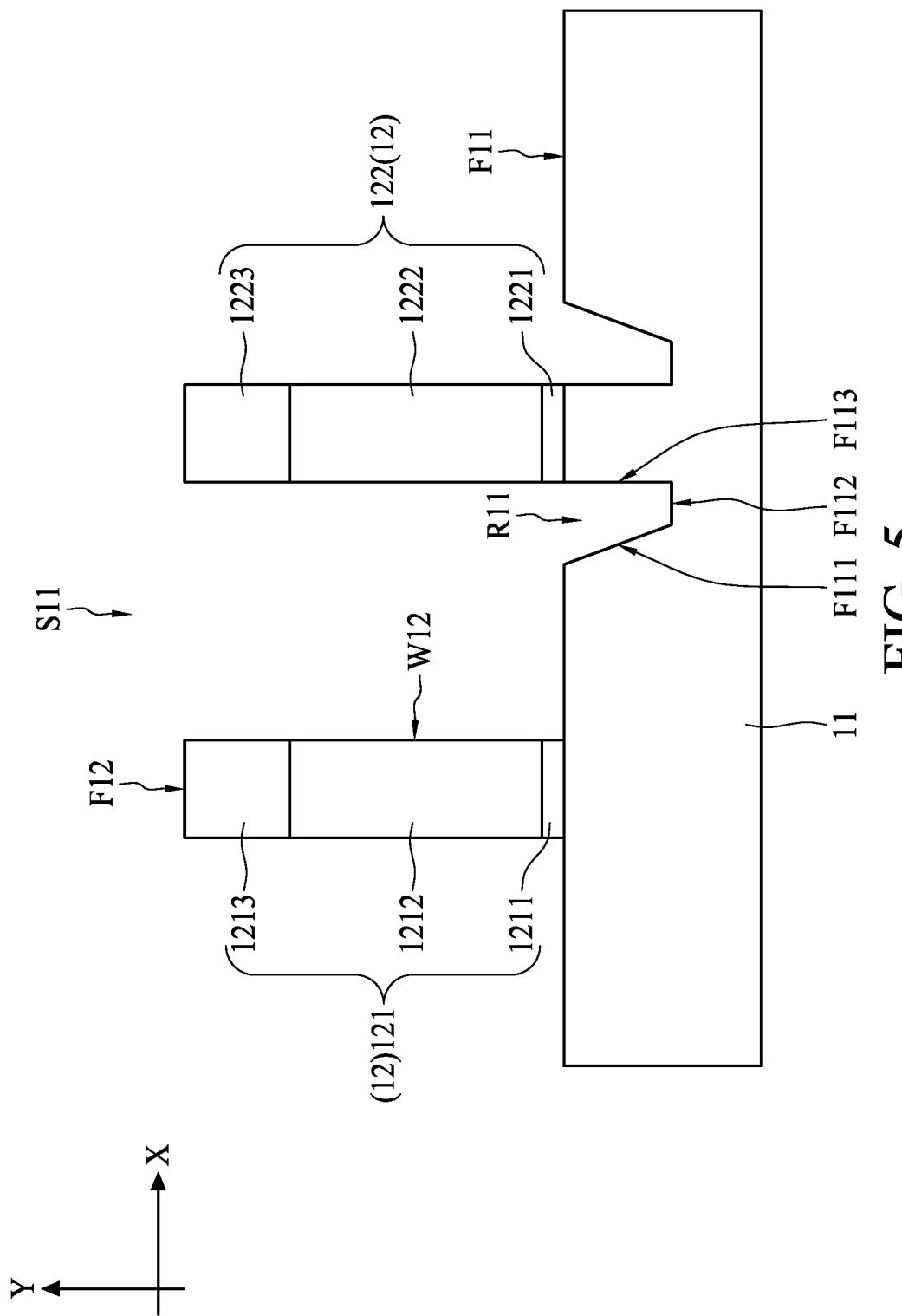
FIGS. 5 to 14 are schematic views of a semiconductor structure at various stages of manufacture by a method in accordance with some embodiments of the present disclosure.

Referring to FIG. 5, in accordance with some embodiments of the present disclosure and the operations O101 to O102 of the method M10, a substrate 11 is received or provided, and one or more bit line structures 12 are formed on a top surface F11 of the substrate 11. In some embodiments, a plurality of bit line structures 12 include a bit line structure 121 and a bit line structure 122. In some embodiments, as shown in FIG. 5, recessed portions R11 are formed on the top surface F11 of the substrate 11 adjacent to two lateral sides of the bit line structure 122, and the bit line structure 121 is formed on the planar portion of the top surface F11 of the substrate 11 with no recessed portions R11 nearby. In some embodiments, the recessed portion R11 includes a tilt surface F111, a bottom surface F112, and a vertical surface F113 (vertical as used herein refers to a direction along the Y direction). In some embodiments, the vertical surface F113 is substantially coplanar to a lateral sidewall of the bit line structure 122.

In some embodiments, the bottom surface F112 is substantially horizontal (horizontal as used herein refers to a direction along the X direction), and is at a bottom of the recessed portion R11 of the top surface F11 and connects the tilt surface F111 to the vertical surface F113. In some embodiments, the tilt surface F111 is opposite to the vertical surface F113 in the cross-sectional view, as shown in FIG. 5, and is connected to the vertical surface F111 by the bottom surface F112.

In some embodiments, the bit line structure 121 includes a metal nitride layer 1211 (e.g., a titanium nitride layer), a bit line layer 1212 (e.g., a tungsten layer) and a hard mask layer 1213 (e.g. nitride layer) stacked in sequence on the top surface F11 of the substrate 11. In some embodiments, similar to the bit line structure 121, the bit line structure 122 includes a metal nitride layer 1221 (e.g., a titanium nitride layer), a bit line layer 1222 and a hard mask layer 1223 (e.g. nitride layer) stacked in sequence on the top surface F11 of the substrate 11. Each of the bit line structures 12 has a top surface F12 facing away from the substrate 11 and a sidewall W12 connecting the top surface of the bit line structure 12 to the substrate 11.

In accordance with some embodiments of the present disclosure, as shown in FIG. 5, the different bit line structures 121 and 122 are disposed adjacent to each other. However, the present disclosure is not limited thereto. In some embodiments, there are only bit lines having structures similar to the bit line structure 121 formed over the substrate 11. In some embodiments, bit lines having structures similar to the bit line structure 122 or the bit line structure 121 are formed over the substrate 11. In some embodiments, there is no recessed portion R11 formed adjacent to the bit line structure 122 and no recessed portion R11 formed adjacent to the bit line structure 121. In some embodiments, there are recessed portions R11 on the top surface F11 formed adjacent to the bit line structure 121. Details of arrangement of stacked materials of the bit line structures 12 or configurations of the top surface F11 of the substrate 11 are not limited herein and can be adjusted according to different applications.

Figure 6:
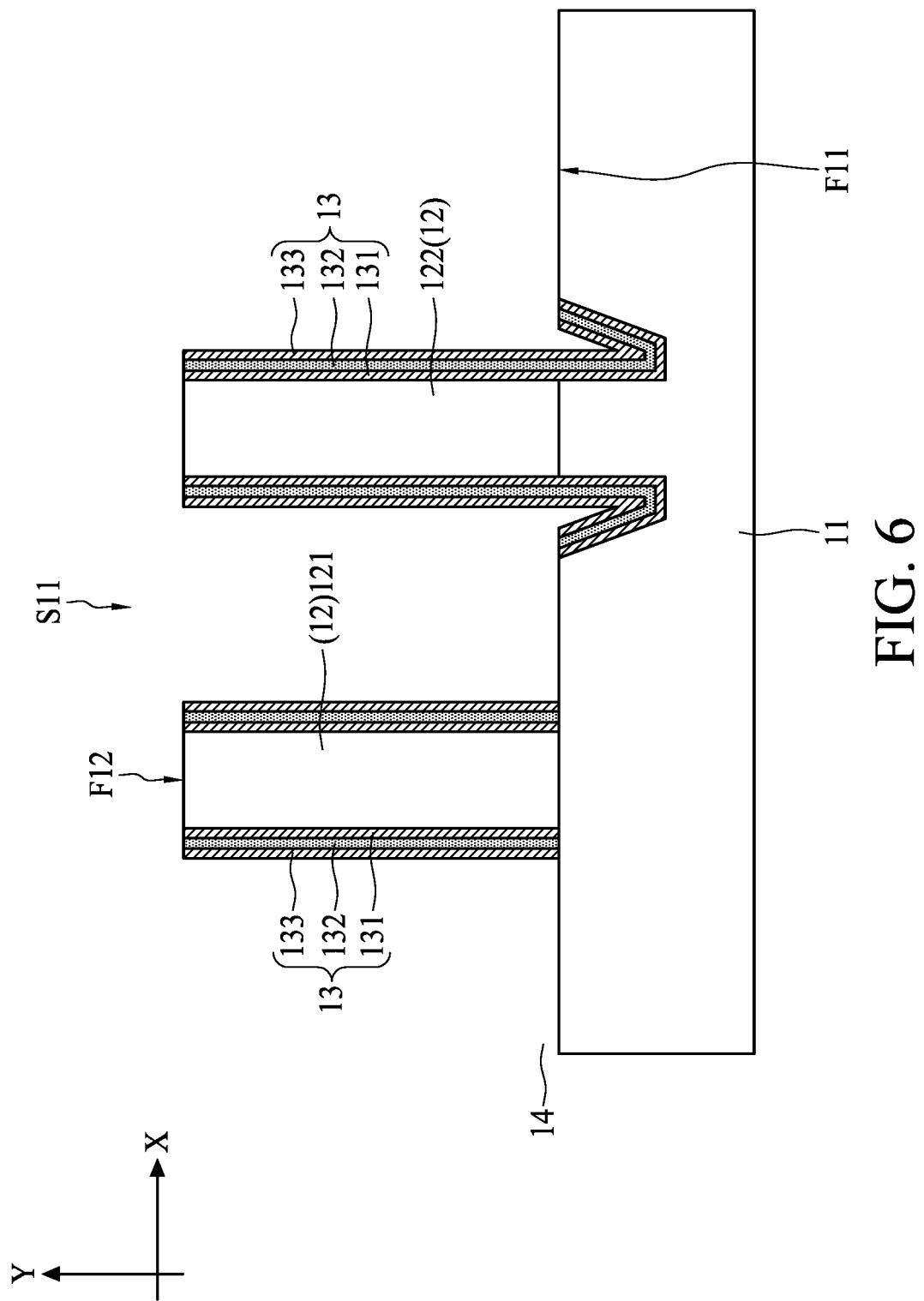

Referring to FIG. 6, in accordance with some embodiments of the present disclosure, the method M10 further includes forming spacer structures 13 on two opposite lateral sides of the bit line structures 12. In some embodiments, the spacer structure 13 includes a first dielectric layer 131, a second dielectric layer 132 and a third dielectric layer 133.

In some embodiments, the first dielectric layer 131 is formed on the front side S11 of the substrate 11. In some embodiments, the first dielectric layer 131 is formed over the substrate 11 and the bit line structures 12, and is conformal to a profile of the bit line structures 12 and the substrate 11. In some embodiments, the first dielectric layer 131 is formed on the lateral sidewalls and covering the tops of the bit line structures 12. In some embodiments, a portion of the first dielectric layer 131 has a profile conformal to the recessed portions R11 of the top surface F11 of the substrate 11. In some embodiments, the first dielectric layer 131 is formed in the recessed portions R11 of the top surface F11 of the substrate 11.

In some embodiments, the second dielectric layer 132 is formed on the front side S11 of the substrate 11 over the first dielectric layer 131. In some embodiments, the second dielectric layer 132 is formed over and conformal to the first dielectric layer 131. In some embodiments, the second dielectric layer 132 has a profile conformal to the profile of the bit line structures 12 and the substrate 11, and also conformal to the profile of the first dielectric layer 131. In some embodiments, the second dielectric layer 132 is formed on the lateral sidewalls and covering the tops of the bit line structures 12. In some embodiments, a portion of the second dielectric layer 132 has a profile conformal to the recessed portions R11 of the top surface F11 of the substrate 11. In some embodiments, the second dielectric layer 132 is formed in the recessed portions R11 of the top surface F11 of the substrate 11.

In some embodiments, the third dielectric layer 133 is formed on the front side S11 of the substrate 11 over the second dielectric layer 132. In some embodiments, the third dielectric layer 133 is formed over and conformal to the substrate 11, the bit line structures 12, the first dielectric layer 131, and the second dielectric layer 132. In some embodiments, a thickness of each of the dielectric layers 131, 132 and 133 is in a range of 5 to 10 nanometers. In some embodiments, the dielectric layers 131, 132 and 133 include different materials. In some embodiments, two adjacent dielectric layers of the dielectric layers 131, 132 and 133 include different materials having different etching selectivity to an etchant. In some embodiments, the first dielectric layer 131 and the third dielectric layer 133 are made of same materials. In some embodiments, the first dielectric layer 131 and the third dielectric layer 133 are oxide, and the second dielectric layer 132 is nitride. In some embodiments, the first dielectric layer 131 and the third dielectric layer 133 are nitride, and the second dielectric layer 132 is oxide.

In some embodiments, horizontal portions of the dielectric layers 131, 132 and 133 are next removed by, for instance, a directional etching operation. In some embodiments, the spacer structure 13 including the dielectric layers 131, 132, and 133 is formed as shown in FIG. 6.

In some embodiments without the recesses R11, the spacer structure 13 is disposed on the two opposite lateral sidewalls of the bit line structures 12. In some embodiments with the recesses R11 adjacent to the bit line structures 12, the spacer structure 13 is disposed on the two opposite lateral sidewalls of the bit line structures 12 and also in the recesses R11. In some embodiments, the recesses R11 are completely filled by the spacer structure 13 depending on a size of the recess R11 and a thickness of the spacer structure 13.

Figure 7:
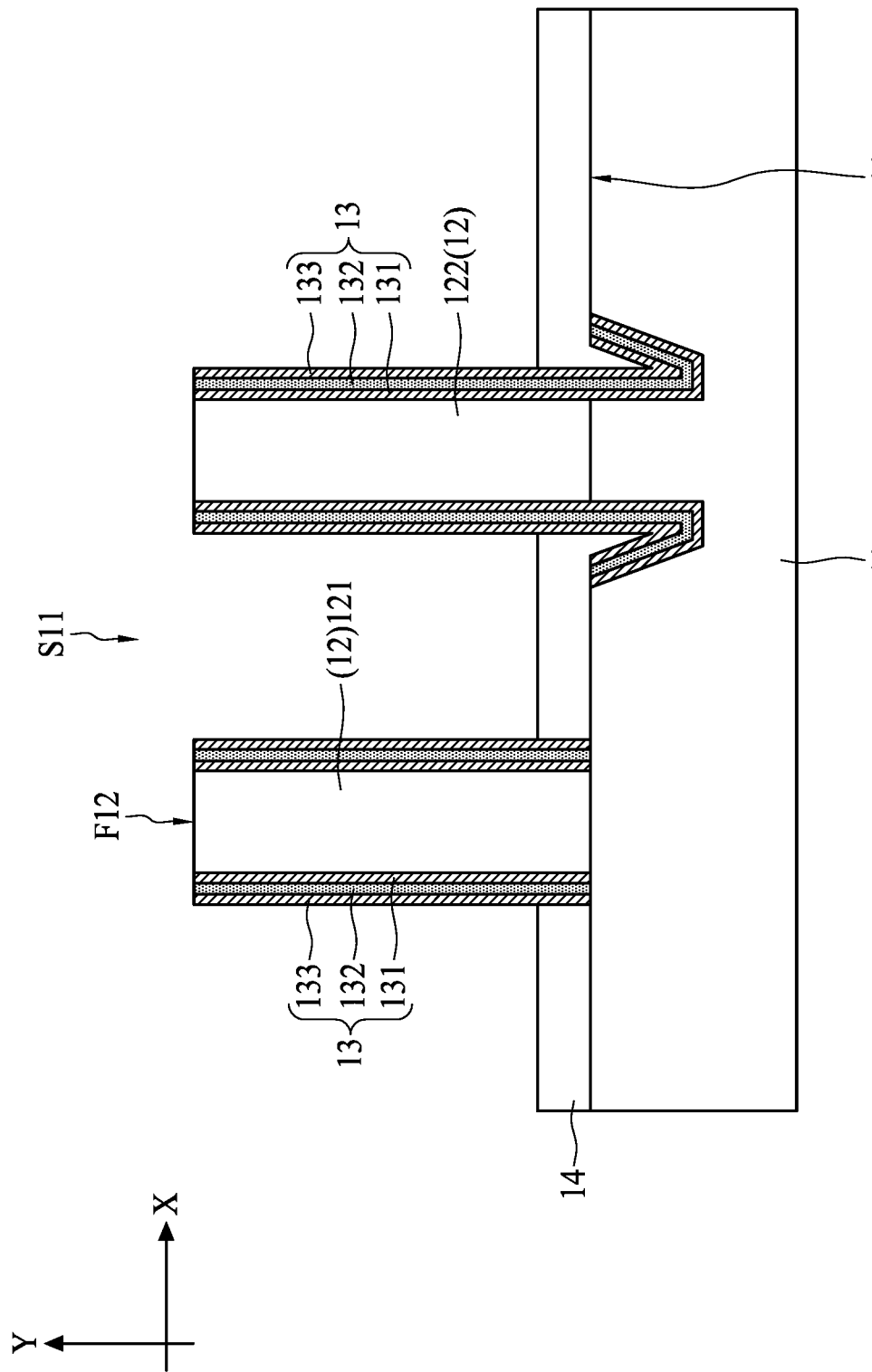

Referring to FIG. 7, in accordance with some embodiments of the present disclosure, the method M10 further includes forming a polysilicon layer 14. In some embodiments, the polysilicon layer 14 is formed over the front side S11 of the substrate 11, covering the top surface F11 of the substrate 11, a portion of the bit line structures 12 and a portion of the spacer structure 13 adjacent to the substrate 11. In some embodiments, the polysilicon layer 14 is formed by blanket deposition operation of polysilicon followed by an etching operation to remove a portion of the polysilicon to form the polysilicon layer 14.

Figure 8:
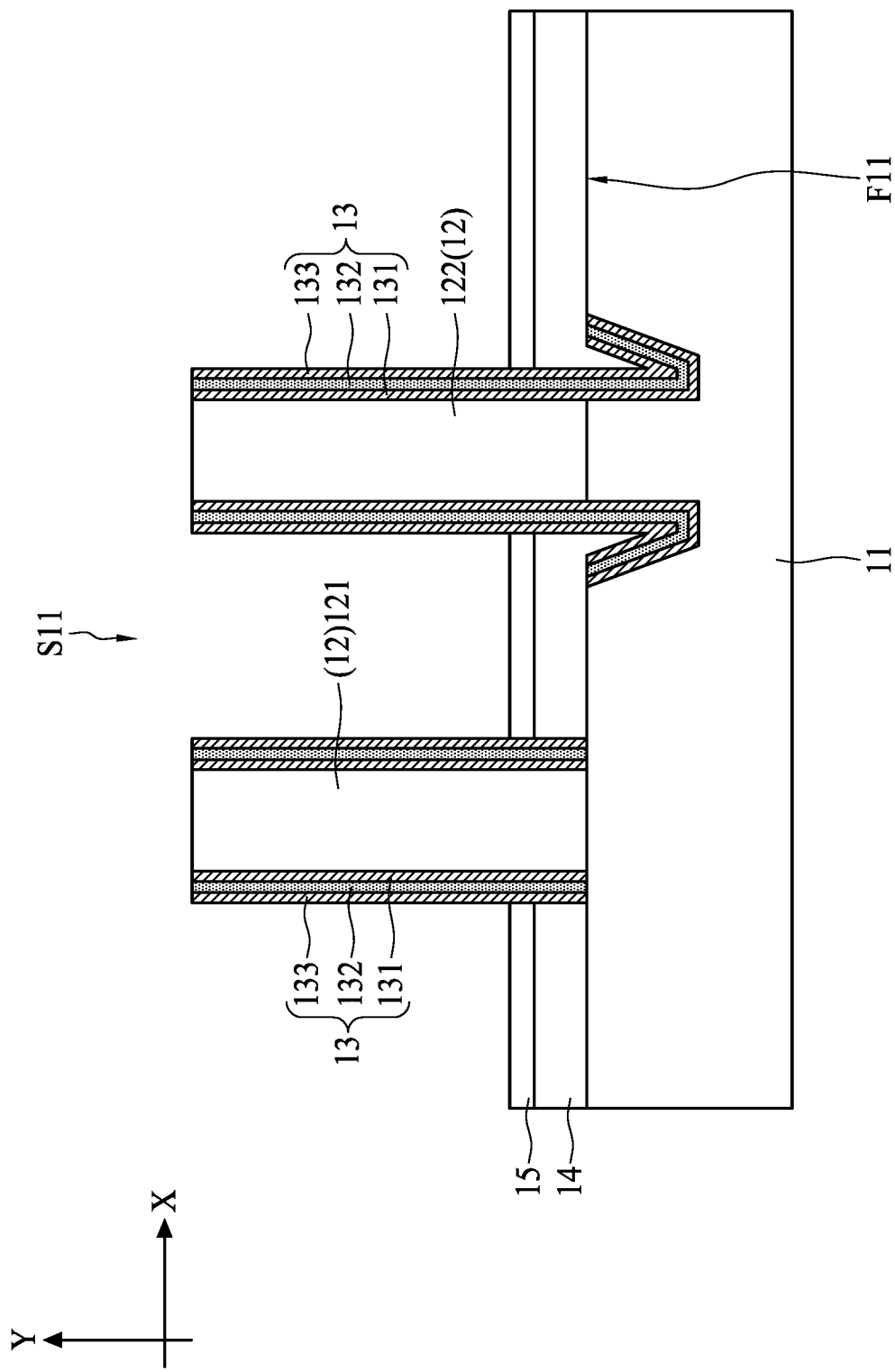

Referring to FIG. 8, in accordance with some embodiments of the present disclosure, the method M10 further includes forming a metal layer 15. In some embodiments, a metal deposition operation is performed to form the metal layer 15 over the polysilicon layer 14 and adjacent to the bit line structures 12. In some embodiments, the metal layer 15 includes at least one of cobalt and titanium. Other suitable materials can be used in other embodiments, and the material is not limited herein. In some embodiments, the metal layer 15 can be formed by a suitable deposition operation to cover the entire bit line structures 12, the spacer structures 13, and the polysilicon layer 14, and an etching operation is next performed to reveal portions of the bit line structures 12 and the spacer structures 13. Conventional techniques can be applied, and the technique is not limited herein.

Figure 9:
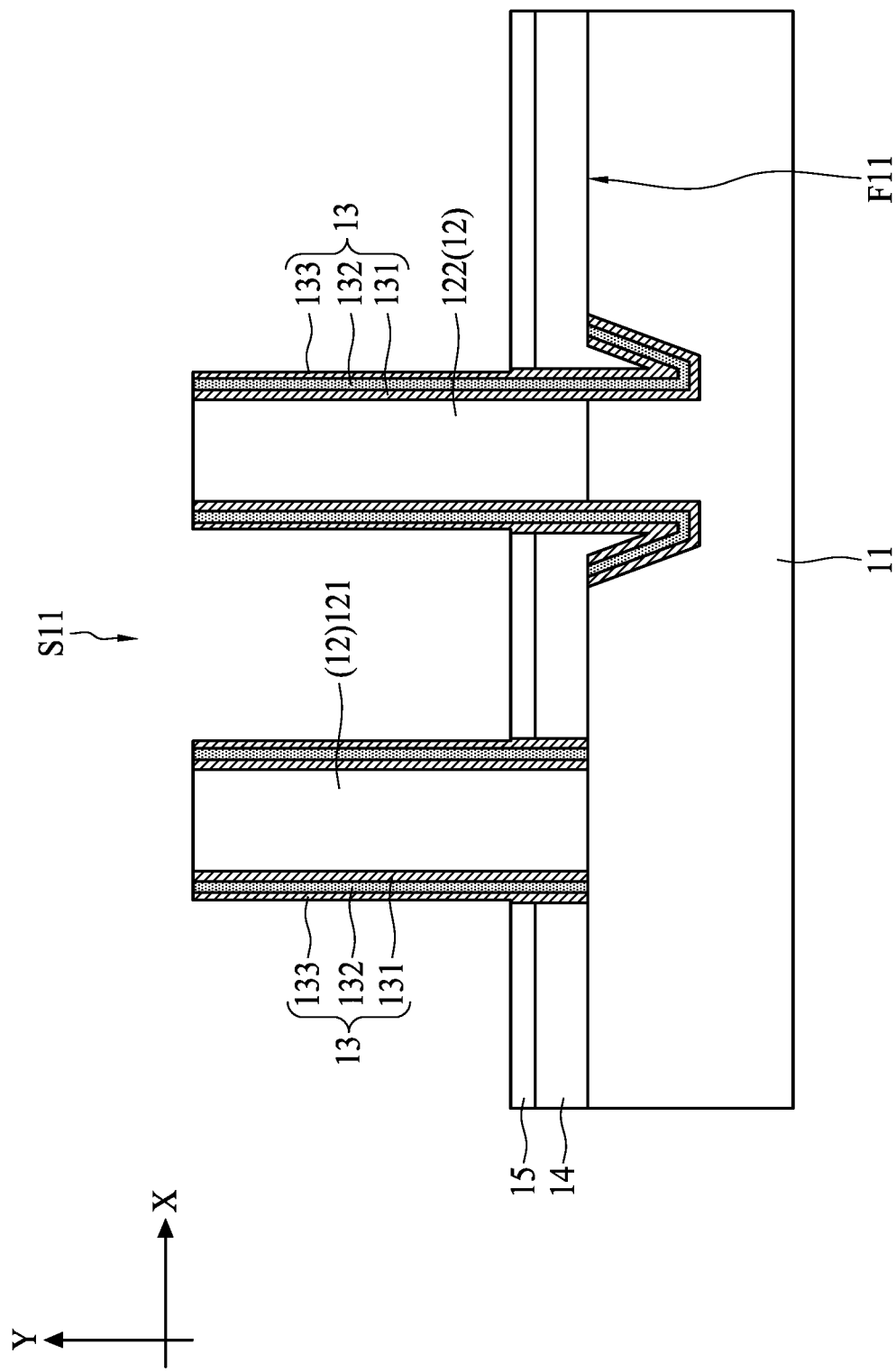

In some embodiments, the method M10 further includes performing a pre-metal cleaning operation prior to the formation of the metal layer 15. In some embodiments, the method M10 further includes performing a post-metal cleaning operation after the formation of the metal layer 15. Other cleaning operations or sub-operations can be optionally applied, and are not limited herein. As the pre-metal cleaning operation and/or the post-metal cleaning operation may consume some of the exposed third dielectric layer 133 are removed as shown in FIG. 9. A thickness of the exposed portion of the third dielectric layer 133 is less than a thickness of a protected portion of the third dielectric layer 133, covered by the metal layer 15. For a purpose of ease of illustration, in the following description of FIGS. 10 to 16, subsequent operations are performed on the intermediate structure as shown in FIG. 8.

Figure 10:
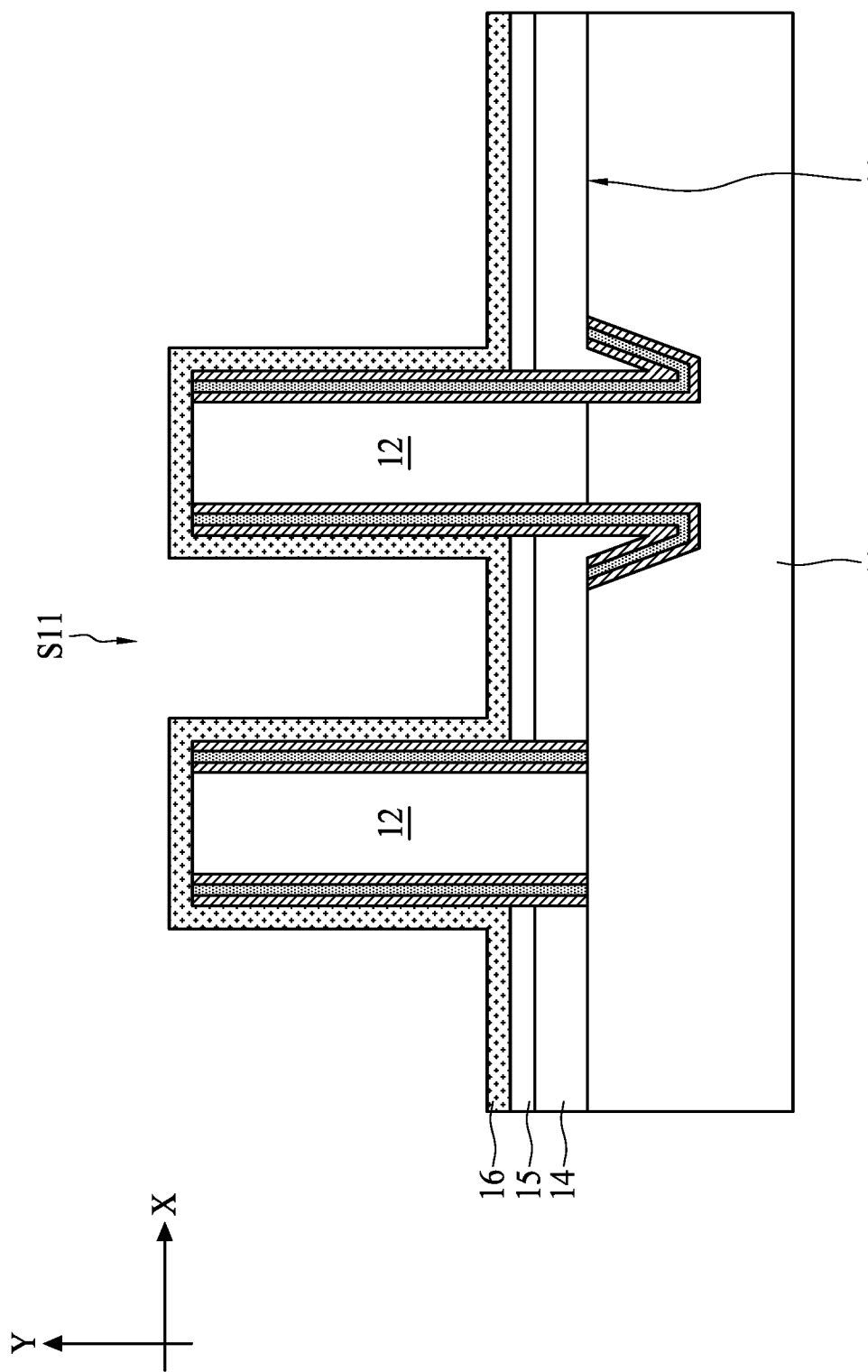

Referring to FIG. 10, in accordance with some embodiments of the present disclosure, the method M10 further includes forming an adhesion layer 16. In some embodiments, the adhesion layer 16 is formed over the substrate 11 and covering the bit line structures 12. For ease of illustration, the spacer structure 13 is hereinafter illustrated as a part of the corresponding bit line structure 12. In some embodiments, the adhesion layer 16 is conformal to the bit line structures 12 and the metal layer 15. In some embodiments, the adhesion layer 16 includes titanium nitride (TiN), tantalum nitride (TaN), or a combination thereof. In some embodiments, the adhesion layer 16 is formed by conformal deposition, chemical vapor deposition (CVD), physical vapor deposition (PVD) or any other suitable operation.

Figure 11:
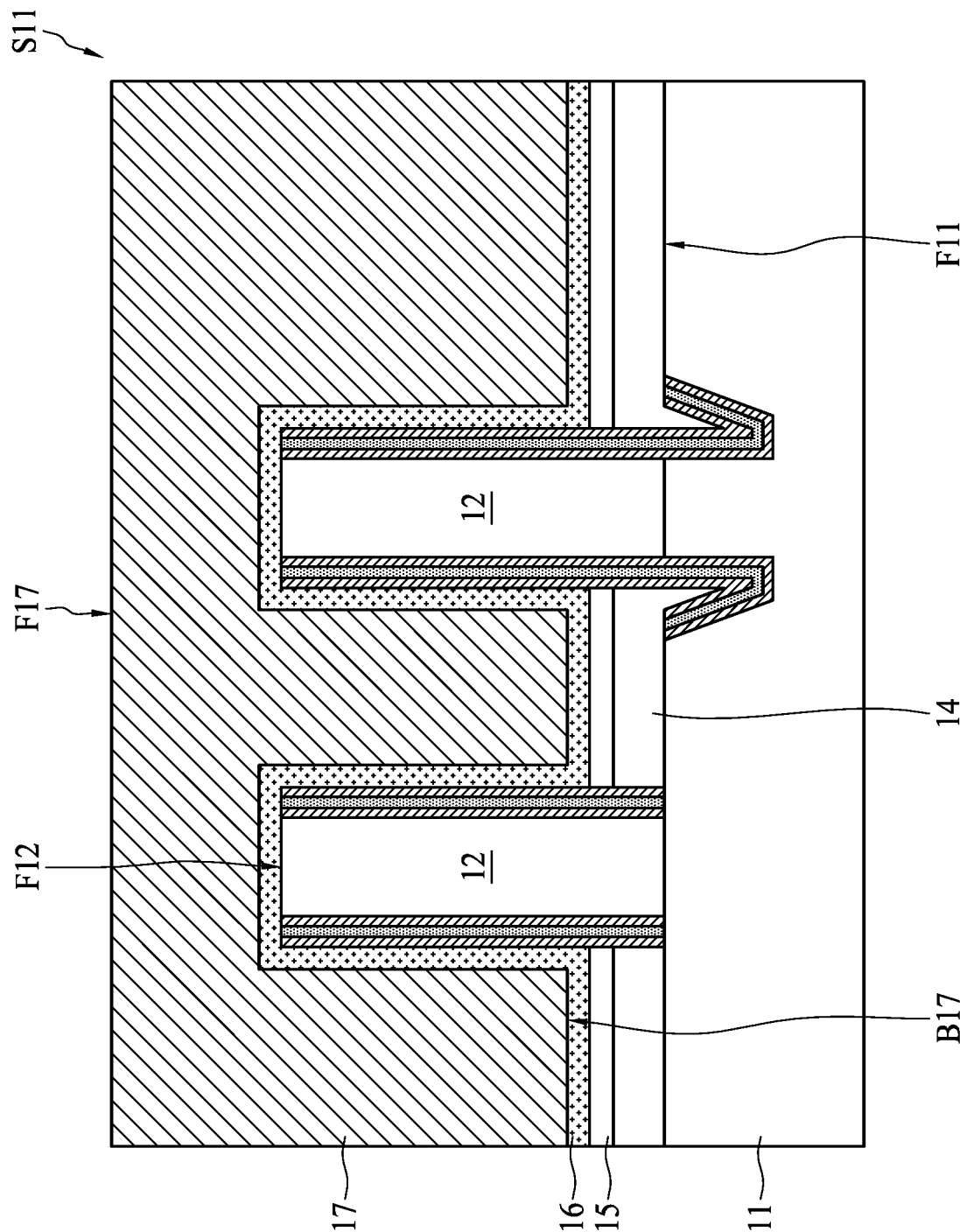
Figure 12:
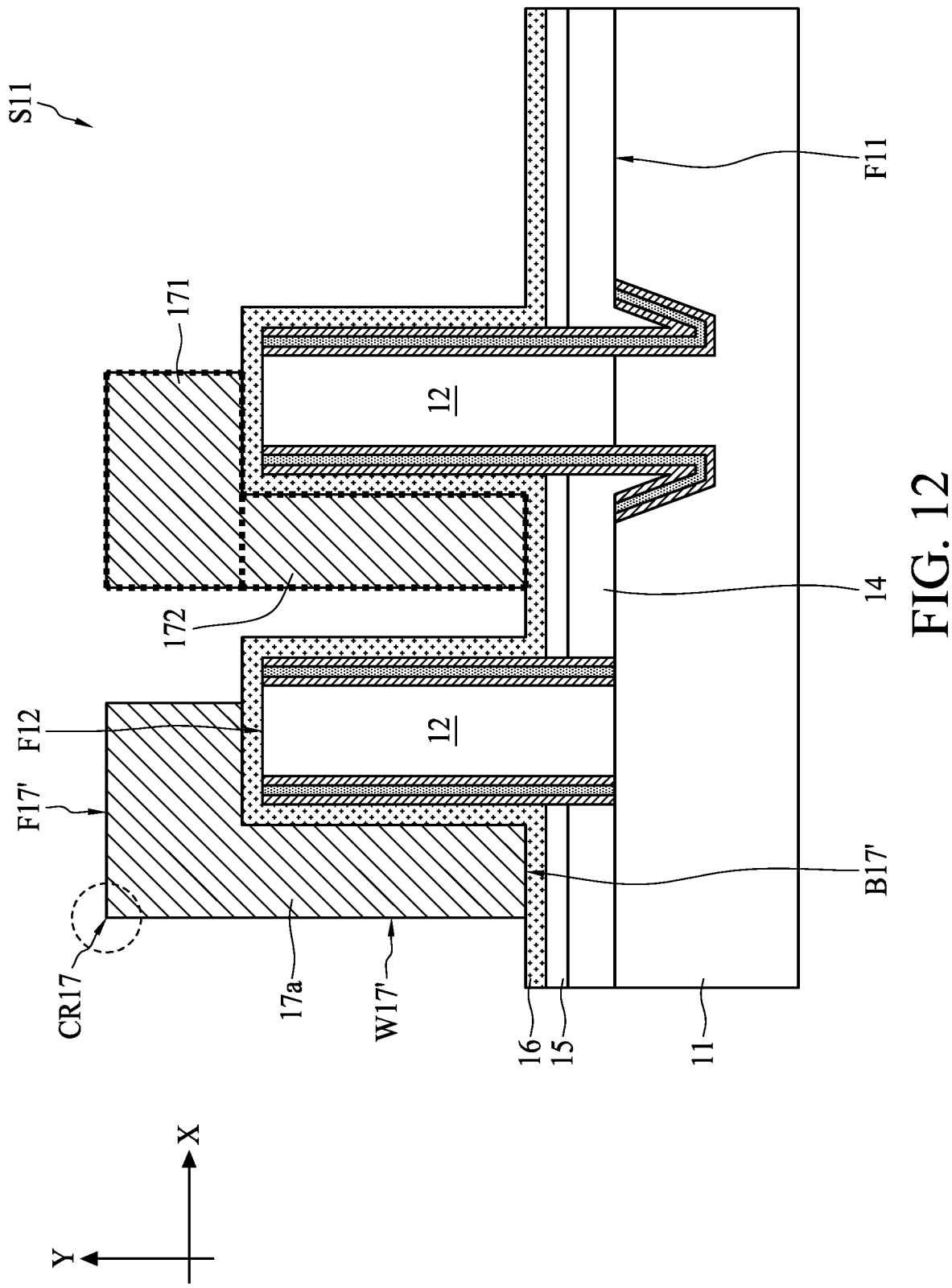
Figure 13:
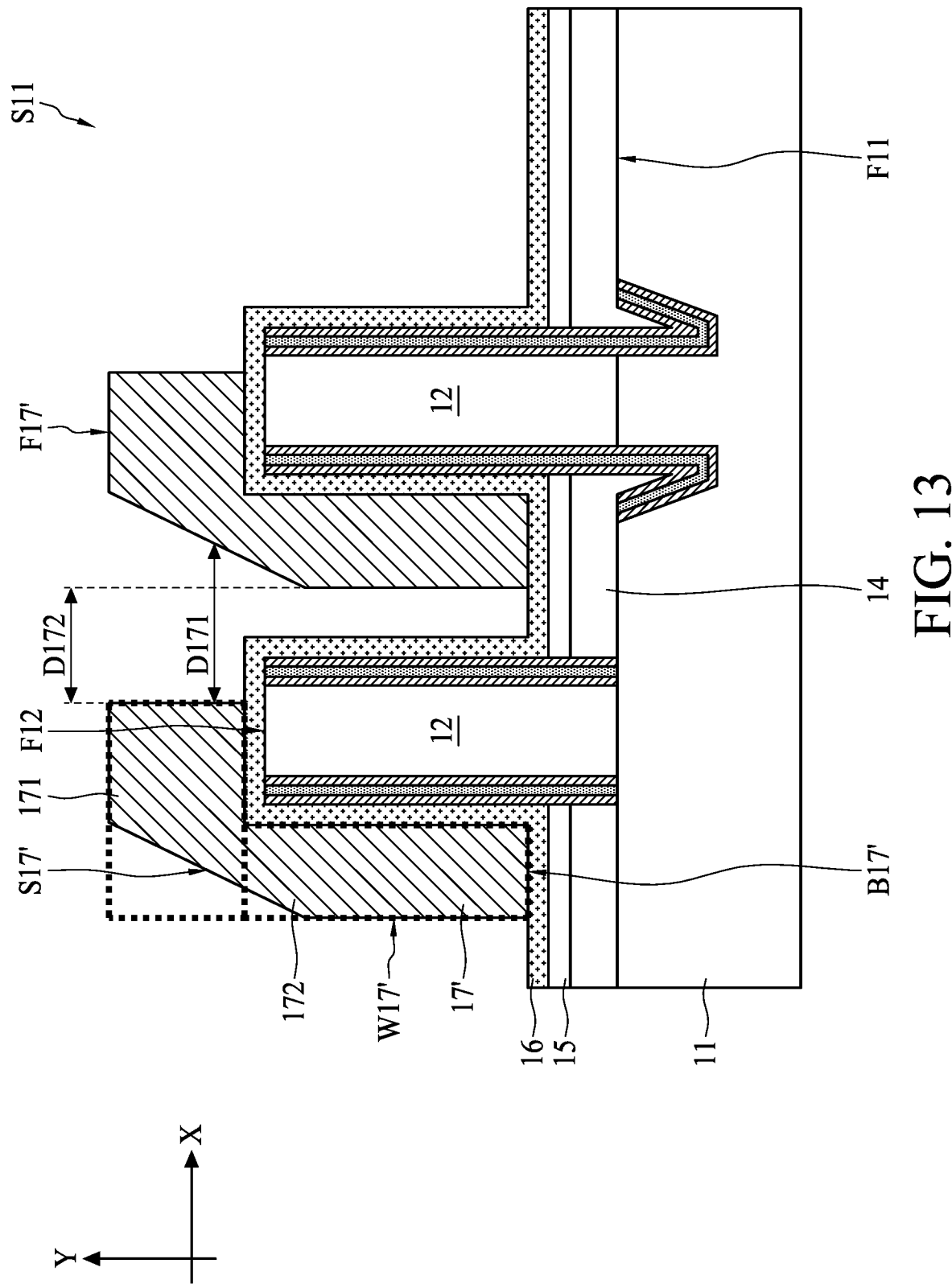

Referring to FIGS. 11 to 13, in accordance with some embodiments of the present disclosure and the operations O103 to O104 of the method M10, a landing pad 17' is formed over the bit line structure 12, covering the sidewall W12 and a portion of the top surface F12 of the bit line structure 12. In some embodiments, as shown in FIG. 11, a conductive material layer 17 is deposited over the front side S11 of the substrate 11, covering the bit line structures 12 and the adhesion layer 16. In some embodiments, the conductive material layer 17 has a top surface F17 and a bottom surface B17 opposite to the top surface F17, wherein the bottom surface B17 contacts the adhesion layer 16 over the substrate 11. In some embodiments, the conductive material layer 17 includes metal, e.g., tungsten, copper, or other suitable metal material. In some embodiments, the conductive material layer 17 is formed by blanket deposition.

Referring to FIG. 12, in some embodiments, a portion of the conductive material layer 17 is removed to form a plurality of landing pads 17a, which is an intermediate landing pad structure. In some embodiments, the portion of the conductive material layer 17 is removed by an etching operation. In some embodiments, at least a portion of the top of each of the bit line structures 12 (a portion of the hard mask layer 1213 or 1224 and a portion of the spacer structure 13) is not covered by (or not overlapped by) the landing pad 17a from the cross-sectional view, as shown in FIG. 12. In some embodiments, a top surface F17' of the landing pad 17a in FIG. 12 is a portion of the top surface F17 of the conductive material layer 17 in FIG. 11. In some embodiments, the top surface F17' of the landing pad 17a in FIG. 12 is coplanar with the top surface F17 of the conductive material layer 17 in FIG. 11. In addition, in some embodiments, a sidewall W17' of the landing pad 17a directly connects to the top surface F17' of the landing pad 17a to form a relatively sharp top corner CR17 (such top corner CR17 may not be a perfectly right-angled corner). In some embodiments, the top corner CR17 is defined by the sidewall W17' and the top surface F17' (the top corner CR17 may be a slightly rounded corner, but can still be defined by the substantially horizontal top surface F17' and the substantially vertical sidewall W17' under a microscope or on a TEM or SEM image), wherein the sidewall W17' connects the top surface F17' of the landing pad 17a to a bottom surface B17' of the landing pad 17a.

In some embodiments, the landing pad 17a includes a first portion 171 and a second portion 172. In some embodiments, the first portion 171 of the landing pad 17a is above the bit line structure 12 for interconnection to other electrical components of a device. In some embodiments, the second portion 172 of the landing pad 17a is laterally adjacent to the bit line structure 12 and between the plurality of bit line structures 12 for forming electrical paths of the first portion 171 and source/drain regions.

Referring to FIG. 13, in accordance with some embodiments of the present disclosure, the top corner CR17 of the landing pad 17a in FIG. 12 is removed to form an inclined surface S17' connecting the top surface F17' and the sidewall W17' of the landing pad 17a; thus, a landing pad 17' with the inclined surface S17' is formed. In some embodiments, a portion of the first portion 171 of the landing pad 17a is firstly removed, and then a portion of the second portion 172 of the landing pad 17a is removed, to form the landing pad 17' with the inclined surface S17'. In some embodiments, at least a portion of the inclined surface S17' is formed between the bit line structures 12. In some embodiments, a distance D171 between the first portions 171 of two adjacent landing pads 17' is greater than a distance D172 between the first portion 171 of a landing pad 17' and the second portion 172 of an adjacent landing pad 17'.

In some embodiments, the top corner CR17 in FIG. 12 is removed by an etching operation, e.g., a tilt dry-etching operation, and the inclined surface S17' in FIG. 13 is a substantially flat surface. In some embodiments, the configuration of the inclined surface S17' shown in FIG. 13 is for a purpose of illustration only. Other configurations of the inclined surface can be formed depending on different etching operations, as shown in FIGS. 15 to 16 and in accordance with different embodiments of the present disclosure.

Figure 15:
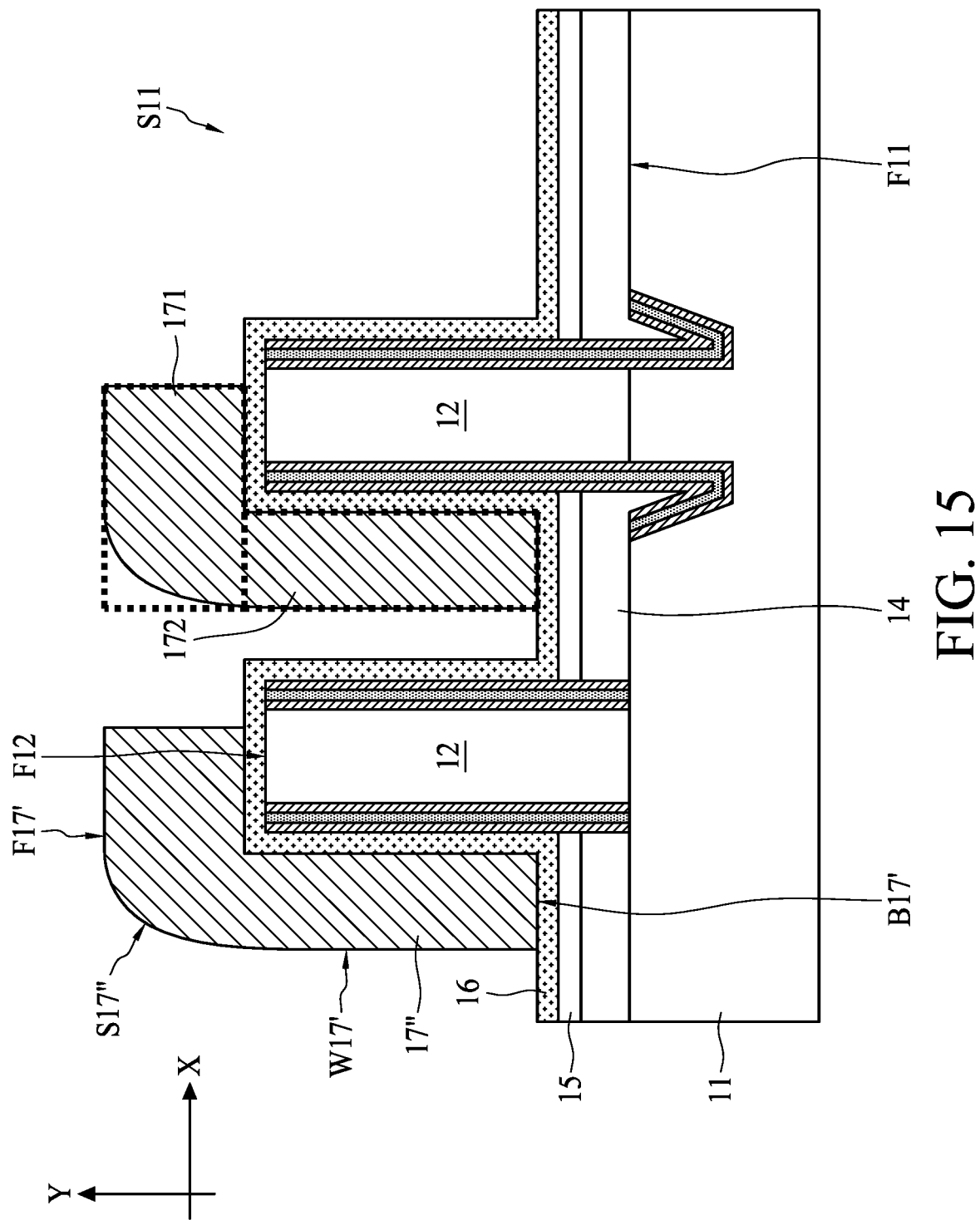
FIGS. 15 to 16 are cross-sectional diagrams of semiconductor structures manufactured by a method in accordance with different embodiments of the present disclosure.
Figure 16:
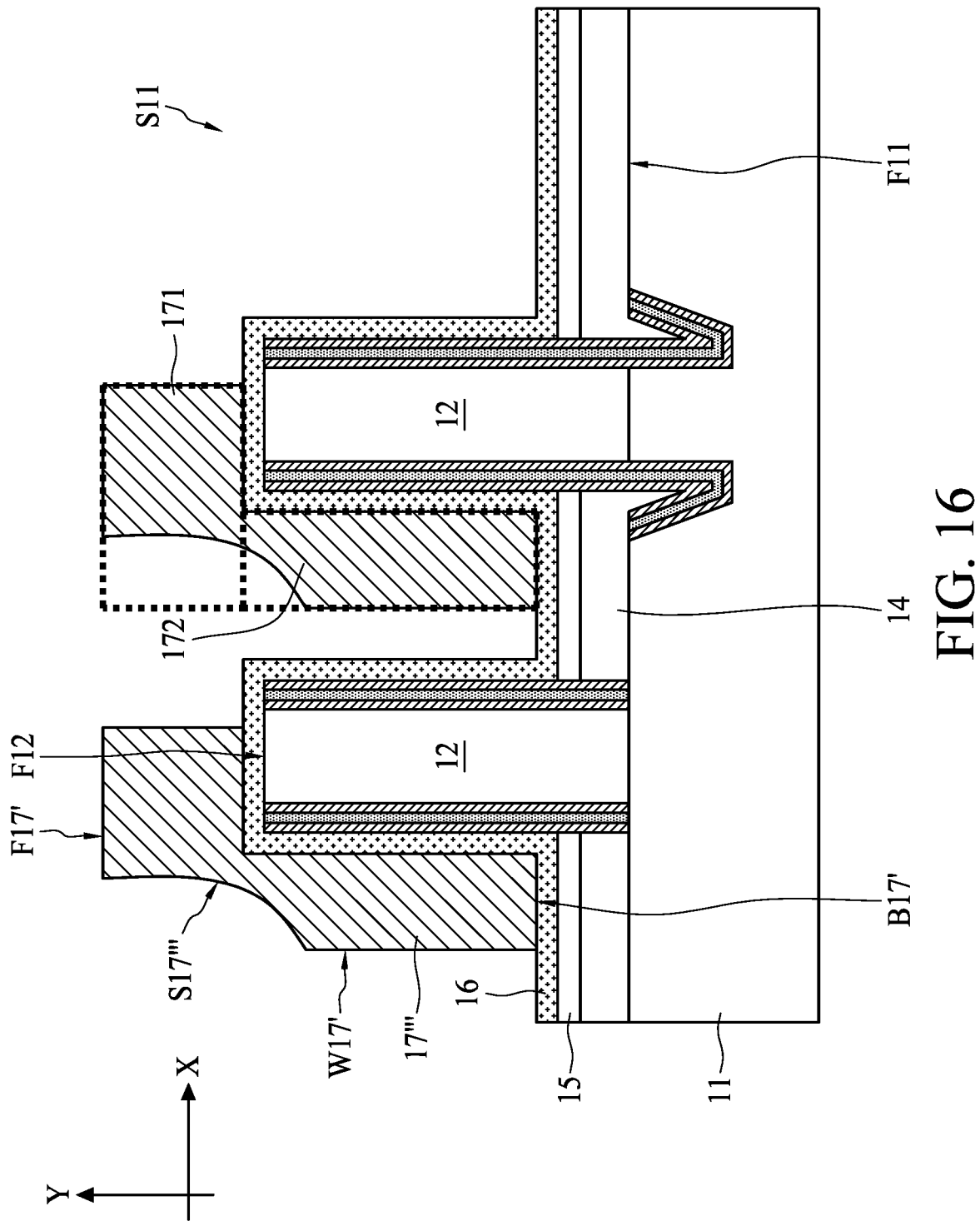

Referring to FIG. 15, in accordance with some embodiments of the present disclosure, a spacer etching operation is performed to remove the corner CR17 of the landing pad 17a in FIG. 12. In the embodiments as shown in FIG. 15, a landing pad 17" including an inclined surface S17" is formed, wherein the inclined surface S17" is a convex surface protruding away from the bit line structure 12. Referring to FIG. 16, in some embodiments, a directional etching is performed to remove the top corner CR17 of the landing pad 17a in FIG. 12, and the resulting inclined surface S17'" of a landing pad 17'" includes a concavity facing away from the bit line structure 12. In some embodiments, multiple etching operations are performed to achieve a desired configuration or a combined configuration of the inclined surface S17'.

Figure 14:
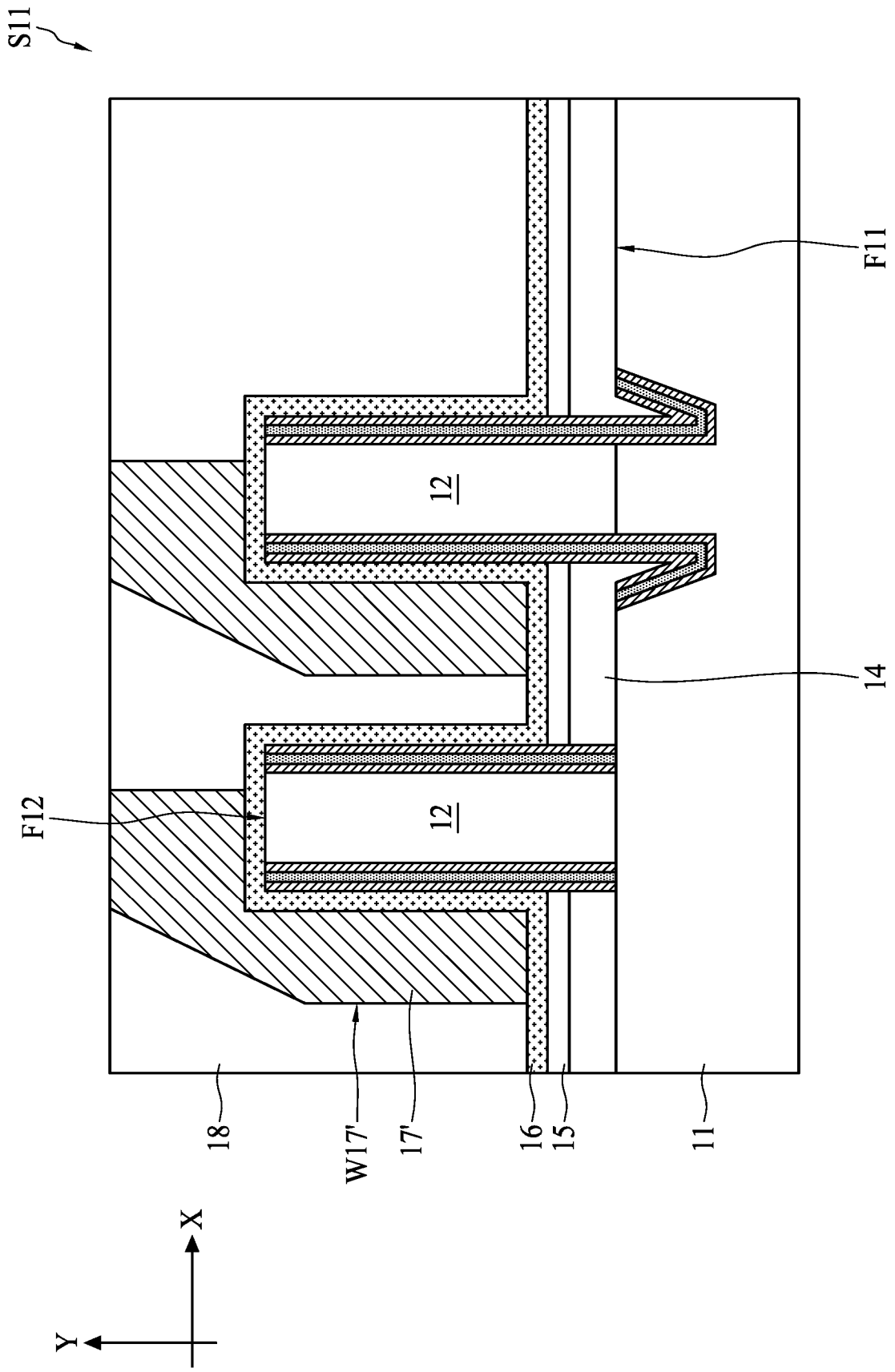

Referring to back to FIG. 14, in accordance with some embodiments, the method M10 further includes forming a seal layer 18 over the front side S11 of the substrate 11. In some embodiments, the seal layer 18 is a multi-layered structure. In some embodiments, the seal layer 18 covers the bit line structures 12 and the landing pads 17' with only the top surfaces F17' of the landing pads 17' exposed. In some embodiments, the seal layer 18 is formed by a chemical vapor deposition (CVD), an atomic layer deposition (ALD) or a combination thereof.

In some embodiments, prior to formation of the seal layer 18, the method M10 further includes removing the second dielectric layer 132, thereby forming an air gap (not shown) between the first dielectric layer 131 and the third dielectric layer 133. In some embodiments, a portion of the adhesion layer 16 exposed through the landing pad 17' (or the landing pad 17" or 17'") is removed, and the second dielectric layer 132 at a top of the bit line structure 12 is exposed. In some embodiments, a wet etching operation is performed to remove the second dielectric layer 132 without removal of the first dielectric layer 131 and the third dielectric layer 133; thus, a spacer structure having an air gap is formed.

With the above-mentioned methods and configurations thereof, a landing pad structure having an inclined surface can be formed. As a result, a greater distance between tops of two adjacent landing pads can be achieved, and metal bridging of two landing pads due to very narrow spacing can be prevented.

In an aspect of the present disclosure, a method for manufacturing a semiconductor structure is provided. The method includes: receiving a substrate; forming a first bit line on the substrate, the bit line having a top surface away from the substrate and a sidewall connecting the top surface of the bit line to the substrate; forming a landing pad over the first bit line, covering the sidewall and a portion of the top surface of the first bit line; and removing a top corner of the landing pad to form an inclined surface connecting a top surface to a sidewall of the landing pad.

In another aspect of the present disclosure, a semiconductor structure is provided. The semiconductor structure includes: a substrate; a first bit line, disposed on and protruding from the substrate, and having a sidewall and an ascending top portion, wherein the sidewall of the first bit line connects the ascending top portion of the bit line to the substrate; and a first landing pad, disposed over the ascending top portion and the sidewall of the first bit line, having an inclined surface corresponding to the ascending top portion of the first bit line.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for manufacturing a semiconductor structure, comprising:
   receiving a substrate;
   forming a first bit line on the substrate, the bit line having a top surface away from the substrate and a sidewall connecting the top surface of the bit line to the substrate;
   forming a landing pad over the first bit line, covering the sidewall and a portion of the top surface of the first bit line; and
   removing a top corner of the landing pad to form an inclined surface connecting a top surface to a sidewall of the landing pad.

2. The method of claim 1, further comprising:
   forming a second bit line on the substrate and adjacent to the first bit line, wherein the landing pad includes a first portion formed over the first bit line and a second portion formed between the first bit line and the second bit line.

3. The method of claim 2, wherein the removal of the top corner of the landing pad includes:
   removing a portion of the first portion of the landing pad; and
   removing a portion of the second portion of the landing pad.

4. The method of claim 2, wherein the inclined surface of the landing pad is formed between the first bit line and the second bit line.

5. The method of claim 1, wherein a spacer etching is performed to remove the top corner of the landing pad, and the inclined surface is a convex surface.

6. The method of claim 1, wherein a directional etching is performed to remove the top corner of the landing pad, and the inclined surface is a concave surface.

7. The method of claim 1, wherein a tilt dry-etching is performed to remove the top corner of the landing pad, and the inclined surface is a substantially flat surface.

8. A semiconductor structure, comprising:
   a substrate;
   a first bit line, disposed on and protruding from the substrate, and having a sidewall and an ascending top portion, wherein the sidewall of the first bit line connects the ascending top portion of the bit line to the substrate; and
   a first landing pad, disposed over the ascending top portion and the sidewall of the first bit line, having an inclined surface corresponding to the ascending top portion of the first bit line.

9. The semiconductor structure of claim 8, wherein the inclined surface of the first landing pad is a curved surface.

10. The semiconductor structure of claim 9, wherein the inclined surface of the first landing pad includes a concavity facing away from the first bit line.

11. The semiconductor structure of claim 9, wherein the inclined surface of the first landing pad includes a convex surface facing away from the first bit line.

12. The semiconductor structure of claim 8, wherein the inclined surface of the first landing pad is a substantially flat surface.

13. The semiconductor structure of claim 8, wherein the inclined surface of the first landing pad extends along substantially the same direction as an extending direction of the ascending portion.

14. The semiconductor structure of claim 8, further comprising:
    a second bit line, disposed adjacent to the first bit line on the substrate; and
    a second landing pad, disposed over a top surface and a sidewall of the second bit line, and adjacent to the first landing pad.

15. The semiconductor structure of claim 14, wherein the first landing pad includes a first portion above the first bit line and a second portion between the first bit line and the second bit line, the second landing pad includes a third portion above the second bit line, and a first distance between the first portion of the first landing pad and the third portion of the second landing pad is greater than a second distance between the second portion of the first landing pad and the third portion of the second landing pad from a cross-sectional perspective.

* * * * *